(12) United States Patent
Huang et al.

(10) Patent No.: US 9,064,841 B2
(45) Date of Patent: Jun. 23, 2015

(54) METAL-OXIDE-METAL CAPACITOR APPARATUS WITH A VIA-HOLE REGION

(75) Inventors: Jiun-Jie Huang, Kaohsiung (TW); Ling-Sung Wang, Tainan (TW); Chi-Yen Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 173 days.

(21) Appl. No.: 13/269,401

(22) Filed: Oct. 7, 2011

(65) Prior Publication Data

US 2013/0087885 A1 Apr. 11, 2013

(51) Int. Cl.
*H01L 21/02* (2006.01)
*H01L 49/02* (2006.01)

(52) U.S. Cl.
CPC ...................................... *H01L 28/40* (2013.01)

(58) Field of Classification Search
CPC .................. H01L 21/76832; H01L 21/76834; H01L 27/11502; H01L 27/11507; H01L 28/55; H01L 23/5223; H01L 28/87; H01L 28/91; H01L 21/28568; H01L 21/31612; H01L 21/3162; H01L 28/40; H01L 28/57; H01L 28/60; H01L 23/642; H01L 2924/19041; H01L 23/5222
USPC .................................. 257/532, 499, E29.343
See application file for complete search history.

(56) References Cited

U.S. PATENT DOCUMENTS

| | | | | |
|---|---|---|---|---|
| 5,583,359 A * | 12/1996 | Ng et al. | ......................... | 257/306 |
| 6,281,541 B1 * | 8/2001 | Hu | ................................... | 257/306 |
| 6,998,712 B2 * | 2/2006 | Okada et al. | ................... | 257/758 |
| 2003/0178663 A1 * | 9/2003 | Sashida | ......................... | 257/303 |
| 2007/0230722 A1 * | 10/2007 | Mori et al. | ..................... | 381/174 |
| 2007/0235838 A1 * | 10/2007 | Wang | ............................. | 257/532 |
| 2009/0224359 A1 * | 9/2009 | Chang et al. | ................... | 257/522 |
| 2010/0276783 A1 * | 11/2010 | Cathey et al. | ................. | 257/532 |
| 2012/0119326 A1 * | 5/2012 | Sugisaki et al. | ............... | 257/532 |

* cited by examiner

*Primary Examiner* — Duy T Nguyen
(74) *Attorney, Agent, or Firm* — Slater & Matsil, L.L.P.

(57) ABSTRACT

A metal-oxide-metal capacitor comprises a first electrode, a second electrode, a plurality of first fingers and a plurality of second fingers. Each first finger and its corresponding second finger are in parallel and separated by a low k dielectric material. A via-hole region is employed to enclose the metal-oxide-metal capacitor so as to remove the moisture stored in the low k dielectric material.

22 Claims, 6 Drawing Sheets

US 9,064,841 B2

METAL-OXIDE-METAL CAPACITOR APPARATUS WITH A VIA-HOLE REGION

BACKGROUND

Modern electronic devices such as a notebook computer comprise a variety of memories to store information. Each memory cell may require at least a capacitor to retain information. According to common practice, metal-oxide-metal (MOM) capacitors can provide adequate capacitance for integrated circuits such as memory circuits. A single layer MOM capacitor may comprise a first metal plate, a second metal plate and an insulation layer deposited between the first metal plate and the second metal plate. The capacitance of the single layer MOM capacitor is proportional to the area of the metal plates and the dielectric constant of the insulation layer.

In order to provide a larger capacitance while keeping a smaller die area of a MOM capacitor, the MOM capacitor may include a plurality of layers stacked together. A multi-layer MOM capacitor may comprise two electrodes. Each electrode is coupled to a plurality of fingers, each of which and its corresponding finger coupled to the other electrode form a sub-capacitor. On one layer of the MOM capacitor, various sub-capacitors are formed by a variety of neighboring fingers. The total capacitance of each layer is equal to the sum of the sub-capacitors on this layer. Furthermore, the electrodes of the multilayer MOM capacitor connect all layers together through a plurality of via-plugs. As a result, the total capacitance of the multilayer MOM capacitor is equal to the sum of the capacitances of all layers of the multiplayer MOM capacitor.

The semiconductor industry has experienced rapid growth due to improvements in the integration density of a variety of electronic components (e.g., transistors, diodes, resistors, capacitors, etc.). This improvement in integration density has come from shrinking the semiconductor process node (e.g., shrink the process node towards small feature sizes, such as 65 nanometers, 45 nanometers, 32 nanometers and below). Semiconductor technologies with small feature sizes lead to more interactions between semiconductor fabrication and design. For example, the impact of moisture stored in a MOM capacitor will become more important for devices with small feature sizes. The moisture stored in a MOM capacitor must be lowered down to a minimum level so as to ensure the devices with small feature sizes meet the performance index to which they are specified.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a guard ring for a multilayer metal-oxide-metal (MOM) capacitor structure. The invention may also be applied, however, to a variety of semiconductor devices.

Figure 1:
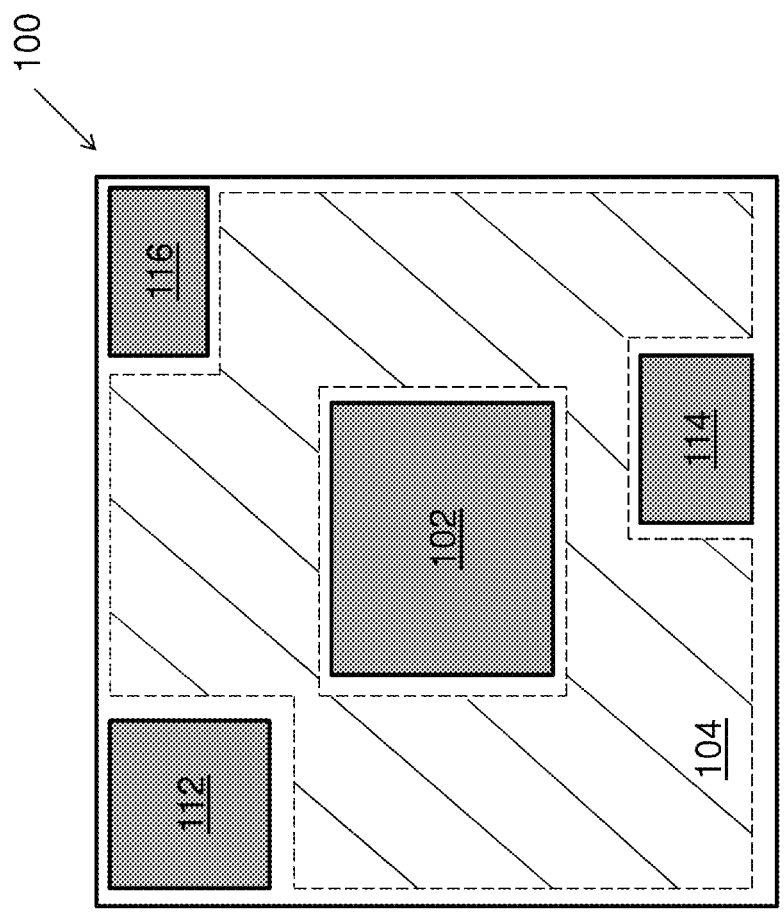
FIG. 1 illustrates a block diagram of an integrated circuit in accordance with an embodiment.

Referring initially to FIG. 1, a block diagram of an integrated circuit is illustrated in accordance with an embodiment. The integrated circuit 100 may comprise a variety of subdivisions, namely a MOM capacitor 102, a first subdivision 112, a second subdivision 114 and a third subdivision 116. As shown in FIG. 1, there may be an opening region (indicated by the dashed line) between the MOM capacitor 102 and three subdivisions. Throughout the description, the opening region is alternatively referred to as a via-hole region 104 since the opening region comprises a plurality of via-holes (not shown but illustrated in detail in FIG. 2). One advantageous feature of filling the opening region with via-holes is that the via-holes help to remove the moisture stored in the insulation layer of the MOM capacitor 102. As a result, the reliability and lifetime of the MOM capacitor 102 can be improved.

Figure 2:
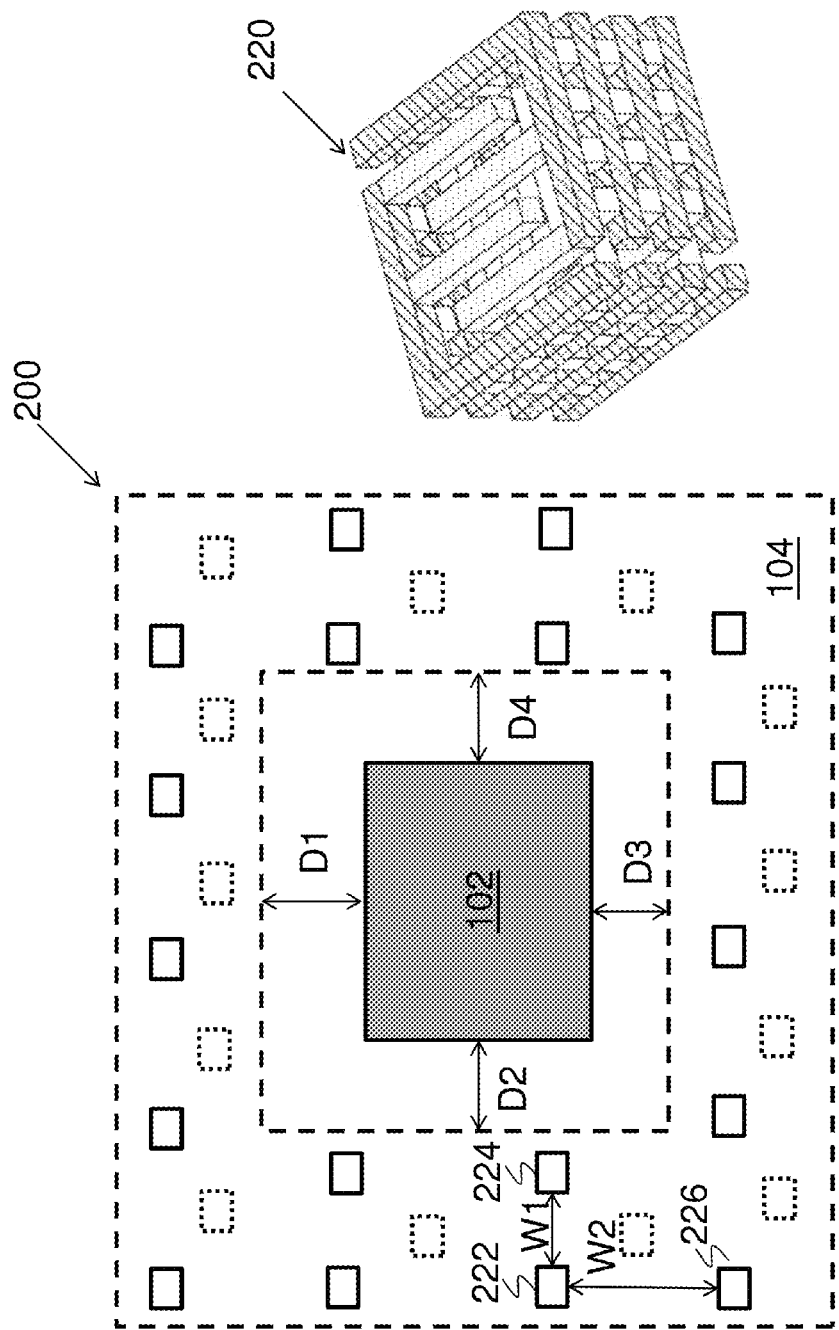
FIG. 2 illustrates a top view of a MOM capacitor apparatus in accordance with an embodiment.

FIG. 2 illustrates a top view of a MOM capacitor apparatus in accordance with an embodiment. The MOM capacitor apparatus 200 may comprise a MOM capacitor 102 and a via-hole region 104. The MOM capacitor 102 may be formed of a plurality of MOM layers stacked together. In accordance with an embodiment, there may be four MOM layers. Each MOM layer may comprise two electrodes and two groups of fingers to form a single layer MOM capacitor. The detailed description of the single layer MOM capacitor will be discussed below with reference to FIG. 3 and FIG. 4. Furthermore, as shown in a perspective view 220 of the MOM capacitor 102, a variety of via-plugs (illustrated in further detail in FIG. 5 and FIG. 6) connect the neighboring MOM layers together. As a result, two corresponding electrodes located in two neighboring layers are connected together. In accordance with the characteristics of capacitors, the electrical equivalent circuit of the MOM capacitor 102 is equal to a plurality of single layer MOM capacitors connected in parallel.

In FIG. 2, the via-hole region 104 may be formed of a plurality of via-holes located in the different layers of the MOM capacitor apparatus 200. As shown in FIG. 2, the rectangles represent the via-holes embedded in the top MOM layer of the MOM capacitor 102. Likewise, the dashed rectangles represent the via-holes embedded in a MOM layer immediately next to the top MOM layer of the MOM capacitor 102. As shown in FIG. 2, the rectangles and the dashed rectangles are configured in a double row staggered pattern.

It should be noted that in order to minimize the impacts from the via-holes on the MOM capacitor 102, the via-holes in a dashed rectangular shape are formed between two neighboring via-holes in a rectangular shape. For example, the via-hole 210 is equally spaced apart from the via-hole 212 and the via-hole 214. As a result, the via-holes in different MOM layers are formed in a staggered pattern. Such a staggered pattern helps to minimize the effects of inductive cross-coupling between the via-holes and the MOM capacitor 102. One person skilled in the art will recognize that while FIG. 2 shows the via-holes are in rectangular shape, the actual shape of the via-holes of a wafer may be of a circular shape due to optical proximity effects. The detailed configuration of the via-hole region 104 will be illustrated below with respect to FIG. 5 and FIG. 6.

As shown in FIG. 2, the distances between each side of the MOM capacitor 102 and the corresponding inner edge of the via-hole region 104 are defined as D1, D2, D3 and D4 respectively. In accordance with an embodiment, the minimum distance between the MOM capacitor 102 and the via-hole region 104 (e.g., D1) is approximately 70 nm. Furthermore, the top view shows that the via-hole region 104 has the shape of a quadrangular frame comprising four straight sides. The distance of two horizontally neighboring via-holes (e.g., via-holes 222 and 224) is defined as W1. Likewise, the distance of two vertically neighboring via-holes (e.g., via-holes 222 and 226) is defined as W2.

In accordance with an embodiment, the minimum distance of two neighboring via-holes (e.g., W1) is approximately 70 nm. In sum, one skilled in the art will realize that either the minimum distance (e.g., D1) between the MOM capacitor and the via-hole region 104, or the minimum distance (e.g., W1) between two adjacent via-holes is related to the technologies used and will be reduced when the semiconductor fabrication technique moves down to the next process node.

It should be noted that while FIG. 2 shows the via-hole region 104 has the shape of a quadrangular frame, this diagram is merely an example, which should not unduly limit the scope of various embodiments. It is within the scope and spirit of various embodiments for the guard ring 104 to comprise other shapes, such as, but no limited to oval, square, or circular. Furthermore, the via-hole region 104 may be of an irregular shape as shown in FIG. 1. In accordance with an embodiment, it is desirable to fill the opening region surrounding the MOM capacitor 102 with a plurality of via-holes. Moreover, the plurality of via-holes are embedded in different MOM capacitor layers and configured in a staggered pattern.

It should further be recognized that while FIG. 2 illustrates the via-hole region 104 with one single MOM capacitor 102, the via-hole region 104 could accommodate any number of MOM capacitors. One advantageous feature of having a via-hole region 104 enclosing the MOM capacitor 102 is that the via-hole region 104 can help to remove the moisture stored in the insulation layer of the MOM capacitor 102 so as to improve the reliability and lifetime of the MOM capacitor 102.

Figure 3:
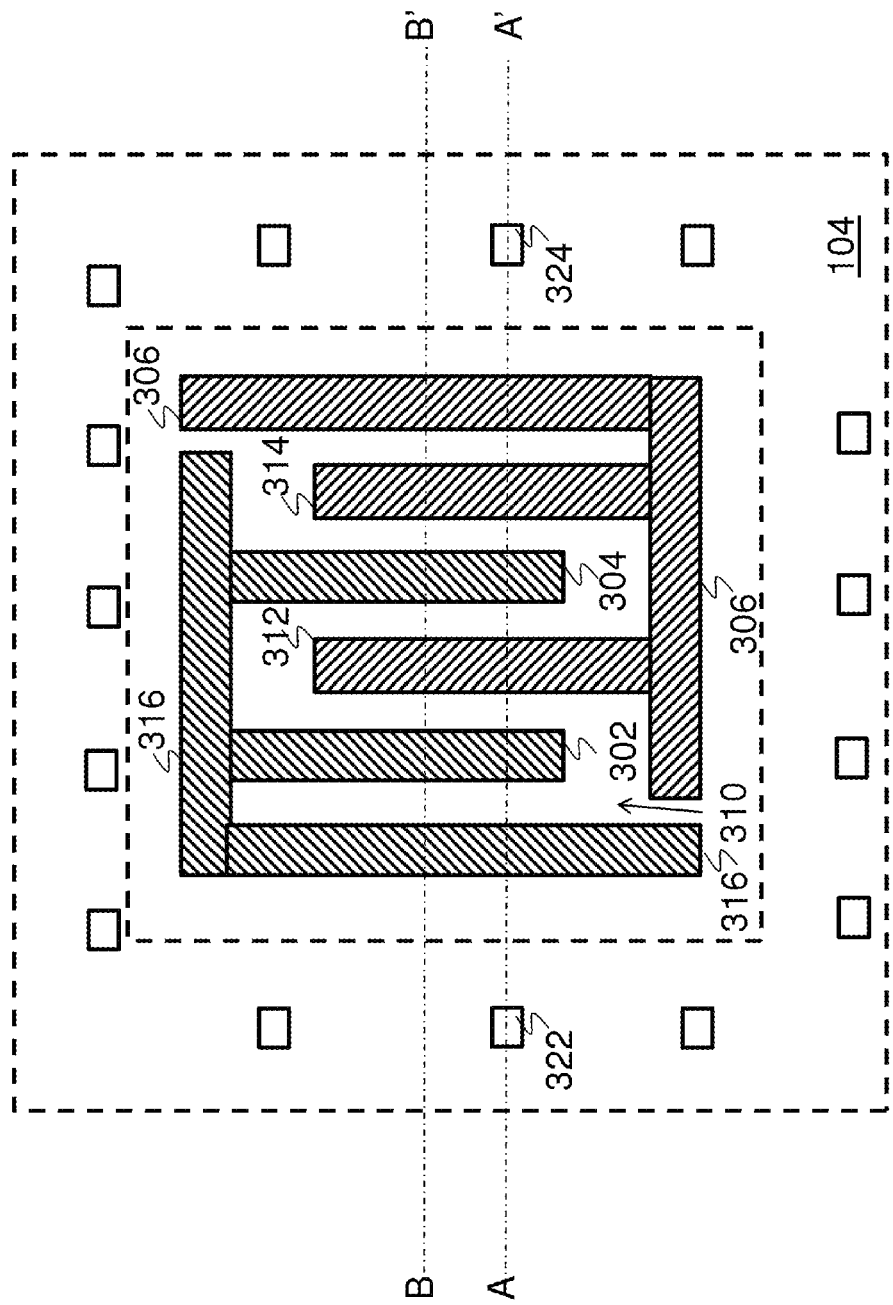
FIG. 3 illustrates a top view of a first MOM layer of a MOM capacitor in accordance with an embodiment.
Figure 4:
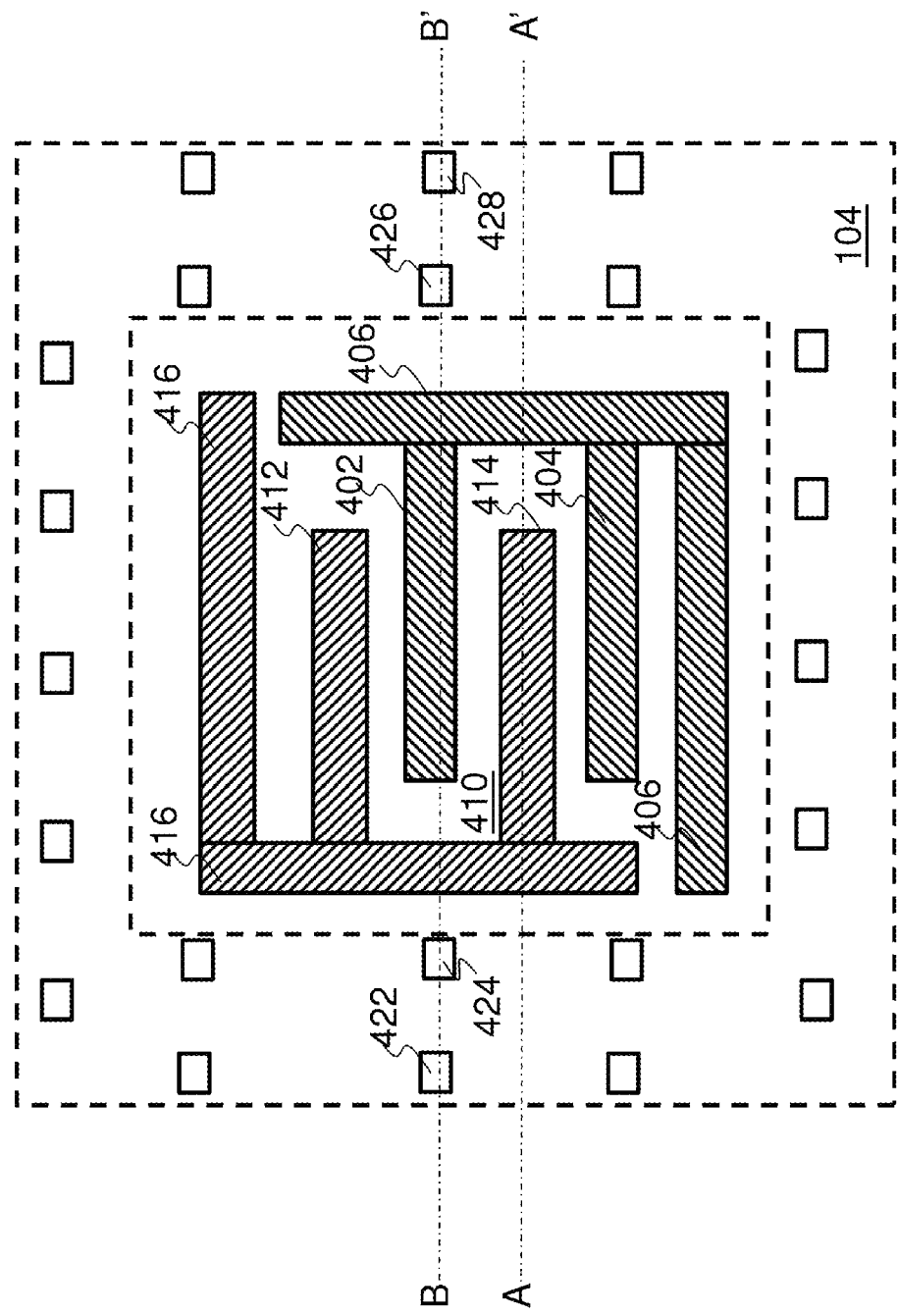
FIG. 4 illustrates a top view of a second MOM layer of a MOM capacitor in accordance with an embodiment.

In accordance with an embodiment, the MOM capacitor 102 may comprise a plurality of MOM layers. The layouts in the different MOM layers may have an alternating pattern. In other words, the top views of the MOM layers with odd numbers are similar to the top view of the first MOM layer. Likewise, the top views of the MOM layers with even numbers are similar to the top view of the second MOM layer. For simplicity, only the first MOM layer and the second MOM layer are shown in FIG. 3 and FIG. 4. The other layers of the MOM capacitor 102 are similar to the first and second MOM layers, and hence are not illustrated in detail to avoid unnecessary repetition.

FIG. 3 illustrates a top view of a first MOM layer of a MOM capacitor in accordance with an embodiment. The first MOM layer comprises two electrodes, namely a first electrode 306 and a second electrode 316. Each electrode may comprise a plurality of fingers. For simplicity, four fingers 302, 304, 312 and 314 are selected to illustrate the configuration of the first MOM layer. As shown in FIG. 3, the fingers 302 and 304 are coupled to the first electrode 306. Likewise, the fingers 312 and 314 are coupled to the second electrode 316. As shown in FIG. 3, two neighboring fingers (e.g., 302 and 312) are in parallel and separated by an insulation material 310. As such, two neighboring fingers may form a sub-capacitor. Furthermore, the electrodes 306 and 316 connected all sub-capacitors in parallel. In accordance with an embodiment, the total capacitance across the first electrode 306 and the second electrode 316 is the sum of two sub-capacitors.

An insulation material 310 fills the vacancy between two neighboring fingers (e.g., 302 and 312) as well as between two electrodes 306 and 316. In accordance with an embodiment, the insulation material 310 is an extreme low k (ELK) material. The ELK material may comprise fluorine-doped oxide, carbon-doped silicon oxide and the like. FIG. 3 further illustrates the via-holes in the dashed rectangular shape shown in FIG. 2. The via-hole region 104 is employed to enclose the electrodes, the fingers as well as the ELM material. The via-hole region 104 helps to remove the moisture from the ELM material of the MOM capacitor 102. As a result, some reliability and lifetime performance indexes such as the ramp voltage break down (VBD) or the time dependent dielectric breakdown (TDDB) of the MOM capacitor 102 can be improved.

FIG. 4 illustrates a top view of a second MOM layer of a MOM capacitor in accordance with an embodiment. FIG. 4 is similar to FIG. 3 except that the orientation of electrodes is configured such that the fingers in the second MOM layer are not overlapped with their corresponding fingers in the first MOM layer. Instead, in accordance with an embodiment, the direction of the fingers in the second MOM layer is orthogonal to the direction of the fingers in the first MOM layer (shown in FIG. 3). An insulation material 410 fills the vacancy between two neighboring fingers as shown in FIG. 4. It should be noted that the electrodes 406 and 416 shown in FIG. 4 are overlapped vertically with their corresponding electrodes (e.g., 306 and 316) shown in FIG. 3. Furthermore, a variety of via-plugs (not shown but illustrated in detail in FIG. 5) are employed to connect the electrodes (e.g., electrode 406) of the second MOM layer and the electrodes (e.g., electrode 306) of the first MOM layer.

Figure 5:
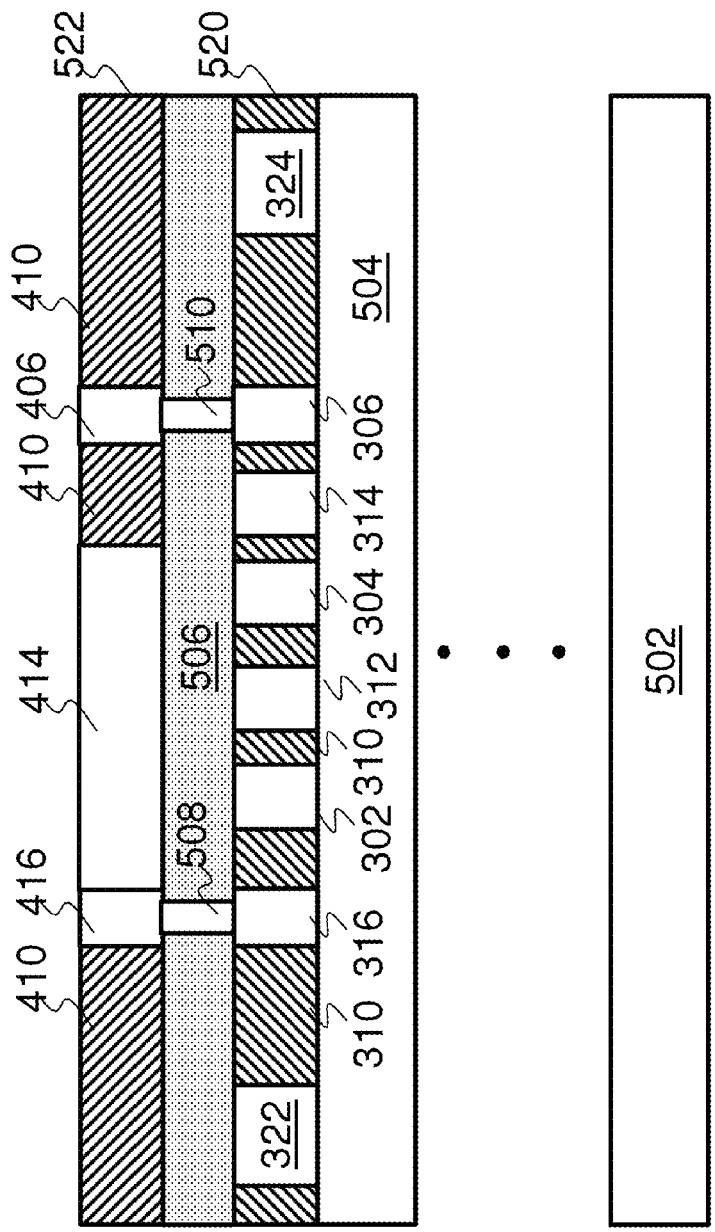
FIG. 5 illustrates a cross-sectional view of the MOM capacitor apparatus in accordance with an embodiment.

FIG. 5 illustrates a cross-sectional view of the MOM capacitor apparatus in accordance with an embodiment. The cross-sectional view of the MOM capacitor apparatus is taken from a plane crossing a line A-A' (shown in FIG. 3 and FIG. 4). As shown in FIG. 5, an inter-layer dielectric layer 504 is formed over a substrate 502. It should be noted that there may be a variety of semiconductor layers between the substrate 502 and the inter-layer dielectric layer 504. The functions of the semiconductor layers are well known, and hence are omitted so as not to hinder the understanding of various embodiments. A first MOM layer 520 comprising an insulating material 310 is formed on the inter-layer dielectric layer 504. The first MOM layer 520 may further comprise fingers 302, 312, 304, 314 as well as the via-holes 322 and 324 (via holes 322 and 324 also illustrated in FIG. 3). The fingers 302, 312, 304 and 314 may be formed of metallic materials such as copper, aluminum and the like.

As shown in FIG. 5, the insulation material 310 is filled between two neighboring fingers made of metallic materials so as to form a capacitor. For example, the finger 302 and the finger 312 may form a sub-capacitor. Likewise, the finger 304 and the finger 314 may form another sub-capacitor. The first MOM layer 520 may further comprises a first via-hole 322 and a second via-hole 324. The first via-hole 512 and the second via-hole 514 are formed outside a MOM capacitor region formed by the fingers 302, 312, 304 and 314.

A dielectric layer 506 is formed on top of the insulation layer 520 and a second MOM layer 522 is formed on top of the dielectric layer 506. In accordance with an embodiment, the dielectric layer 506 is formed of low k dielectric materials. As shown in FIG. 5, via-plugs 508 and 510 are employed to connect the electrodes of the first MOM layer and the electrodes of the second MOM layer. More particularly, the via-plug 508 connects the electrode 316 with the electrode 416. Likewise, the via-plug 510 connects the electrode 306 with the electrode 406. Furthermore, FIG. 5 shows the finger 414 in the second MOM layer 522 is orthogonal to the fingers (e.g., finger 314) in the first MOM layer 520.

Figure 6:
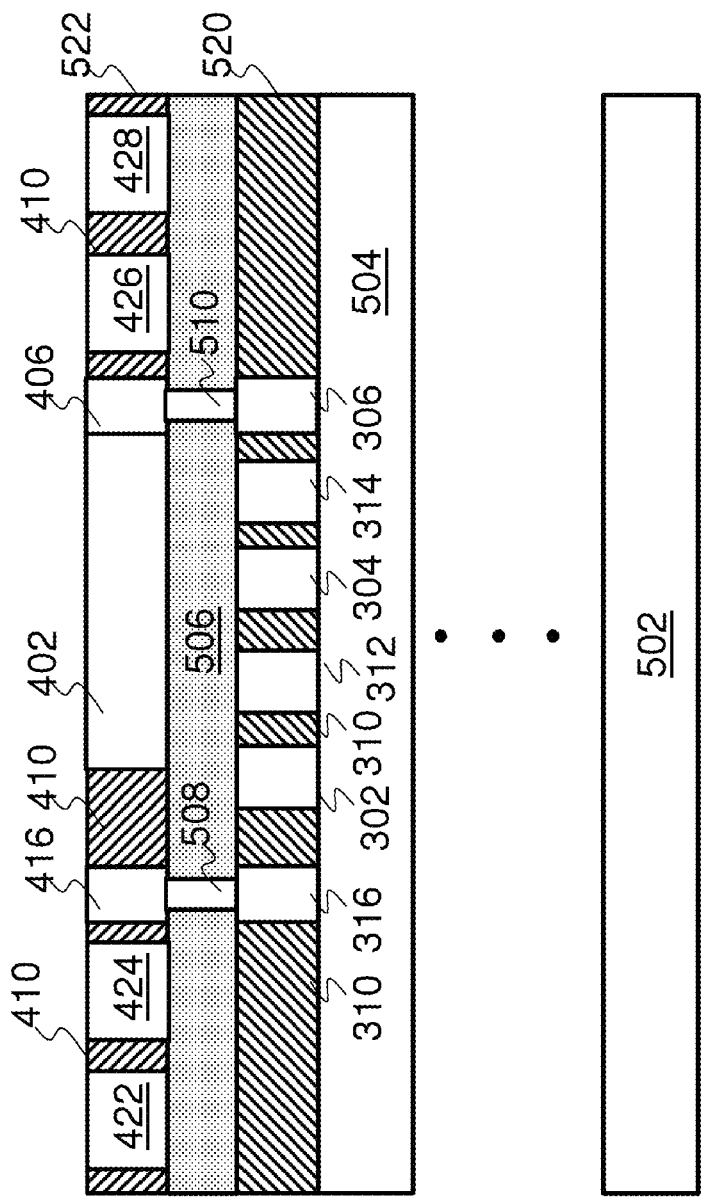
FIG. 6 illustrates another cross-sectional view of the MOM capacitor apparatus in accordance with an embodiment.

FIG. 6 illustrates another cross-sectional view of the MOM capacitor apparatus in accordance with an embodiment. The cross-sectional view of the MOM capacitor apparatus is taken from a plane crossing a line B-B' (shown in FIG. 3 and FIG. 4). FIG. 6 is similar to FIG. 5 except that the via-holes 422, 424, 426 and 428 (also illustrated in FIG. 4) are shown in the second MOM layer 522. One skilled in the art will recognize that the first MOM layer 520 does not have via-holes in this cross-sectional view since via-holes in two adjacent MOM layers are placed in a staggered pattern. An advantageous feature of the via-holes in the second MOM layer is that the via-holes (e.g., via-hole 422) help to facilitate a channel for removing the moisture stored in the insulating layer so that the reliability and lifetime of the MOM capacitor 102 can be improved.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
    a metal-oxide-metal capacitor comprising a low k dielectric insulation layer and a via plug formed in the low k dielectric insulation layer, wherein the metal-oxide-metal capacitor is over a semiconductor substrate; and
    a via-hole region enclosing the metal-oxide-metal capacitor, wherein the via-hole region comprises a plurality of via holes, and wherein the via-hole region comprises upper via holes formed in an upper metal-oxide-metal layer of the metal-oxide-metal capacitor and in direct contact with a first side of the low k dielectric insulation layer and bottom via holes formed in a lower metal-oxide-metal layer of the metal-oxide-metal capacitor and in direct contact with a second side of the low k dielectric insulation layer.

2. The apparatus of claim 1, wherein the upper metal-oxide-metal layer comprising:
    a first electrode coupled to a first finger; and
    a second electrode coupled to a second finger, wherein the first finger and the second finger are in parallel and separated by a first dielectric material.

3. The apparatus of claim 2, wherein the lower metal-oxide-metal layer comprises:
    a third electrode coupled to a third finger; and
    a fourth electrode coupled to a fourth finger, wherein the third finger and the fourth finger are in parallel and separated by a second dielectric material.

4. The apparatus of claim 3, wherein the first electrode is coupled to the third electrode through a plurality of via-plugs.

5. The apparatus of claim 3, wherein the second electrode is coupled to the fourth electrode through a plurality of via-plugs.

6. The apparatus of claim 3, wherein:
    a first direction of the first finger is orthogonal to a third direction of the third finger; and
    a second direction of the second finger is orthogonal to a fourth direction of the fourth finger.

7. The apparatus of claim 1, wherein the via-hole region comprises:
    a plurality of first via-holes in the upper metal-oxide-metal layer of the metal-oxide-metal capacitor; and
    a plurality of second via-holes in the lower metal-oxide-metal layer of the metal-oxide-metal capacitor, wherein the first via-holes and the second via-holes are configured in a staggered pattern.

8. The apparatus of claim 1, wherein the via-hole region comprises a plurality of dummy vias.

9. The apparatus of claim 8, wherein the plurality of dummy vias are floating.

10. A multilayer structure comprising:
    a first metal-oxide-metal layer comprising
        a first finger coupled to a first electrode;
        a second finger coupled to a second electrode, wherein the first finger and the second finger are in parallel;
        a first via-hole outside a first metal-oxide-metal capacitor region formed by the first finger, the first electrode, the second finger and the second electrode;
    a second metal-oxide-metal layer comprising
        a third finger coupled to a third electrode;
        a fourth finger coupled to a fourth electrode, wherein the third finger and the fourth finger are in parallel;
        a second via-hole outside a second metal-oxide-metal capacitor region formed by the third finger, the third electrode, the second finger and the second electrode, wherein the second via-hole forms a channel for removing moisture from the multilayer structure; and
    a dielectric layer comprising:
        a first via-plug coupled between the first electrode and the third electrode; and
        a second via-plug coupled between the second electrode and the fourth electrode, wherein a bottom terminal of the first via-hole is in direct contact with a top surface of the dielectric layer and an upper terminal of the second via-hole is in direct contact with a bottom surface of the dielectric layer.

11. The multilayer structure of claim 10, wherein:
    the first finger and the second finger form a first sub-capacitor; and
    the third finger and fourth finger form a second sub-capacitor.

12. The multilayer structure of claim 11, wherein the first sub-capacitor and the second sub-capacitor form a metal-oxide-metal capacitor.

13. The multilayer structure of claim 12, wherein the first via-hole and the second via-hole form a via-hole region enclosing the metal-oxide-metal capacitor.

14. The multilayer structure of claim 13, wherein the via-hole region fills an opening region surrounding the metal-oxide-metal capacitor.

15. The multilayer structure of claim 10, wherein:
the first finger is separated from the second finger by a first low k dielectric material; and
the third finger is separated from the fourth finger by a second low k dielectric material.

16. The multilayer structure of claim 10, wherein the first finger, the second finger, the first electrode and the second electrode are formed of a first metallic material.

17. The multilayer structure of claim 10, wherein the third finger, the fourth finger, the third electrode and the fourth electrode are formed of a second metallic material.

18. A capacitor comprising:
a first electrode coupled to a plurality of first conductive fingers, wherein
the first conductive fingers are parallel to each other;
a second electrode coupled to a plurality of second conductive fingers, wherein
the second conductive fingers are parallel to each other;
a low k dielectric insulation layer and a via plug formed in the low k dielectric insulation layer; and
a first via-hole region enclosing the first conductive fingers, the second conductive fingers, the first electrode and the second electrode, wherein the first via-hole region comprises a plurality of first via-holes, and wherein upper terminals of the first via-holes are level with a top surface of the first electrode and bottom terminals of the first via-holes are in direct contact with the low k dielectric insulation layer.

19. The capacitor of claim 18, further comprising:
a third electrode coupled to a plurality of third conductive fingers, wherein
the third conductive fingers are parallel to each other; and
the third conductive fingers are in an adjacent layer;
a fourth electrode coupled to a plurality of fourth conductive fingers, wherein
the fourth conductive fingers are parallel to each other; and
the fourth conductive fingers are in the adjacent layer; and
a second via-hole region enclosing the third conductive fingers, the fourth conductive fingers, the third electrode and the fourth electrode.

20. The capacitor of claim 19, wherein:
a first direction of the first conductive fingers is orthogonal to a third direction of the third conductive fingers; and
a second direction of the second conductive fingers is orthogonal to a fourth direction of the fourth conductive fingers.

21. The capacitor of claim 19, wherein the first via-hole region and the second via-hole region are configured such that:
a plurality of first via-holes in the first via-hole region and a plurality of second via-holes in the second via-hole region are in a staggered pattern.

22. The capacitor of claim 21, wherein the first via-holes are equally spaced apart from the second via-holes.

* * * * *